United States Patent
Higashijima et al.

(10) Patent No.: US 9,953,852 B2
(45) Date of Patent: Apr. 24, 2018

(54) LIQUID PROCESSING APARATUS (71) Applicant: TOKYO ELECTRON LIMITED, Tokyo (JP)

(72) Inventors: Jiro Higashijima, Kumamoto (JP);
Yuichi Douki, Kumamoto (JP);
Masami Akimoto, Kumamoto (JP);
Shigehisa Inoue, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 14/525,541

(22) Filed: Oct. 28, 2014

(65) Prior Publication Data
US 2015/0114561 A1 Apr. 30, 2015

(30) Foreign Application Priority Data

Oct. 30, 2013 (JP) ................... 2013-225380

(51) Int. Cl.
*H01L 21/67* (2006.01)
*B08B 1/04* (2006.01)

(52) U.S. Cl.
CPC ............ *H01L 21/6715* (2013.01); *B08B 1/04* (2013.01); *H01L 21/6708* (2013.01); *H01L 21/67051* (2013.01); *Y10S 134/902* (2013.01)

(58) Field of Classification Search
CPC ........... Y10S 134/902; H01L 21/67051; H01L 21/6708; H01L 21/67028; H01L 21/67034; H01L 21/67023; H01L 21/68721; H01L 21/68785; B08B 3/02; B08B 1/04; B08B 11/02; B05D 1/005; B05C 11/08

See application file for complete search history.

(56) References Cited

U.S. PATENT DOCUMENTS

| 2002/0050244 A1* | 5/2002 | Engesser ............. H01L 21/6704 118/20 |
| 2007/0240824 A1* | 10/2007 | Kaneko ............. H01L 21/67051 156/345.11 |
| 2009/0253258 A1* | 10/2009 | Hara ................... C23C 18/1628 438/597 |

(Continued)

FOREIGN PATENT DOCUMENTS

| JP | 2008-034656 A | 2/2008 |
| JP | 2011-238967 A | 11/2011 |

(Continued)

*Primary Examiner* — Karla A Moore
*Assistant Examiner* — Margaret D Klunk
(74) *Attorney, Agent, or Firm* — Abelman, Frayne & Schwab (57) ABSTRACT

A liquid processing apparatus of the present disclosure performs a liquid processing by supplying a processing liquid to a substrate that is rotating. A substrate holding unit configured to be rotatable around a vertical axis is provided with a holding surface to attract and hold a bottom surface of the substrate horizontally. A guide unit is formed integrally with the substrate holding unit, disposed around the substrate held in the substrate holding unit, and provided at a position equal to or lower than a height of a top surface of a periphery of the substrate. The guide unit includes a guide surface configured to guide the processing liquid. A rotary cup rotates integrally with the substrate holding unit, and guides the processing liquid towards the cup between the rotary cup and the guide unit.

9 Claims, 6 Drawing Sheets (56) References Cited

U.S. PATENT DOCUMENTS

| | | | | |
|---|---|---|---|---|
| 2010/0227056 A1* | 9/2010 | Takayanagi | ....... | H01L 21/67051 427/240 |
| 2011/0155177 A1* | 6/2011 | Tamura | ............. | H01L 21/02057 134/18 |
| 2014/0137902 A1* | 5/2014 | Aiura | ................ | H01L 21/67051 134/95.2 |
| 2015/0187613 A1* | 7/2015 | Wakiyama | ........ | H01L 21/67051 134/95.1 |

FOREIGN PATENT DOCUMENTS

| | | |
|---|---|---|
| JP | 2012-199408 A | 10/2012 |
| JP | 2013-211377 A | 10/2013 |

* cited by examiner

LIQUID PROCESSING APARATUS

CROSS-REFERENCE TO RELATED APPLICATIONS

This application is based on and claims priority from Japanese Patent Application No. 2013-225380, filed on Oct. 30, 2013, with the Japan Patent Office, the disclosure of which is incorporated herein in its entirety by reference.

TECHNICAL FIELD

The present disclosure relates to a technique for discharging a processing liquid supplied to a substrate that is rotating.

BACKGROUND

In a single liquid processing unit (a liquid processing apparatus) in which a liquid processing is performed on a semiconductor wafer (hereinafter, referred to as a "wafer") serving as a substrate by supplying various processing liquids, an alkaline or acidic chemical liquid is supplied to a wafer surface that is rotating to remove dusts or natural oxides from the wafer surface. The chemical liquid remaining on the wafer surface is removed by a rinse liquid. When the supply of the rinse liquid is stopped while rotating the wafer, the remaining rinse liquid is scattered, so that the wafer is dried.

In the liquid processing unit, a holding unit that rotatably holds the wafer may be provided with a mechanism configured to adjust a flow of a processing liquid discharged from the wafer. For example, Japanese Patent Laid-Open No. 2008-34656 discloses a liquid processing apparatus in which a guide member (a guide unit) configured to guide a processing liquid is provided at substantially the same height as the wafer so as to surround the wafer held in a floating state from a top surface of a rotary plate (a holding unit) by a holding member. The guide member is interposed between an eaves portion provided at an end of the rotary plate and an outer wall (a rotary cup), and the rotary plate (see, e.g., paragraphs 0013, 0019 to 0021, and FIG. 4).

According to the liquid processing apparatus, the processing liquid, or mist generated during the flow is guided to a front or rear surface of the guide member, introduced into a gap between the outer wall and the rotary plate, and then discharged to a lower side of the wafer while changing the flow direction. Therefore, the wafer may be suppressed from being contaminated by backflow of the mist.

However, in the above-mentioned rotary plate, a plurality of holding members is disposed to be spaced apart from each other around the wafer so that the wafer is held by inserting an end surface of the wafer between the plurality of holding members. Therefore, when a force is applied from different positions with respect to the end surface of the wafer, the wafer may be distorted as if the wafer waves along the circumferential direction so that the height of the periphery is changed. When a liquid processing is performed in a state where the wafer is distorted, the processing liquid discharged from the wafer may collide with a body of the guide member, and hence, mist generated by the collision may contaminate the wafer. Further, the processing liquid discharged from the wafer may not be discharged towards a cup by the guide member.

SUMMARY

In an exemplary embodiment, the present disclosure provides a liquid processing apparatus for performing a liquid processing on a substrate. The apparatus includes a substrate holding unit provided with a holding surface to attract and hold a bottom surface of the substrate horizontally; a rotation driving unit configured to rotate the substrate holding unit around a vertical axis; a cup configured to receive a processing liquid supplied to the substrate while the substrate is rotating; a processing liquid supplying unit configured to supply the processing liquid from an upper side of the substrate held in the substrate holding unit; a guide unit formed integrally with the substrate holding unit, disposed around the substrate held in the substrate holding unit, and provided at a position equal to or lower than a height of a top surface of a periphery of the substrate, the guide unit including a guide surface configured to guide the processing liquid and an inner peripheral portion configured to face an outer peripheral surface of the substrate held in the substrate holding unit; and a rotary cup configured to rotate integrally with the substrate holding unit and guide the processing liquid towards the cup between the rotary cup and the guide unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of such problems and an object of the present disclosure is to provide a liquid processing apparatus capable of discharging a processing liquid towards a cup while suppressing generation of mist.

In an exemplary embodiment, the present disclosure provides a liquid processing apparatus for performing a liquid processing on a substrate. The apparatus includes a substrate holding unit provided with a holding surface to attract and hold a bottom surface of the substrate horizontally; a rotation driving unit configured to rotate the substrate holding unit around a vertical axis; a cup configured to receive a processing liquid supplied to the substrate while the substrate is rotating; a processing liquid supplying unit configured to supply the processing liquid from an upper side of the substrate held in the substrate holding unit; a guide unit formed integrally with the substrate holding unit, disposed around the substrate held in the substrate holding unit, and provided at a position equal to or lower than a height of a top surface of a periphery of the substrate, the guide unit including a guide surface configured to guide the processing liquid and an inner peripheral portion configured to face an outer peripheral surface of the substrate held in the substrate holding unit; and a rotary cup configured to rotate integrally with the substrate holding unit and guide the processing liquid towards the cup between the rotary cup and the guide unit.

The liquid processing apparatus may have the following configurations.

The inner peripheral portion is formed with a gap with respect to the outer peripheral surface of the substrate held in the substrate holding unit. A groove is provided in the substrate holding unit below the gap to receive the processing liquid that enters into the gap. The inner peripheral portion has an inclined surface with its vertical cross-section facing the outer peripheral surface of the substrate. The inner peripheral portion has an inclined surface with its vertical cross-section facing the outer peripheral surface of the substrate, the inclined surface is formed with a top surface side inclined surface that ascends from the outer peripheral surface of the substrate towards the guide surface, and a bottom surface side inclined surface that descends from the outer peripheral surface of the substrate towards a top surface of the groove. The guide unit is provided with a drain path to discharge the processing liquid in the groove towards the cup. The groove is provided with a drain path inlet to guide the processing liquid in the groove to the drain path. The drain path is provided with a drain path outlet to discharge the processing liquid in the groove towards a position joining a flow of the processing liquid guided to the guide unit. The guide unit is provided with a gas supply path to supply gas to the gas ejection port. The groove is formed at a position lower than the bottom surface of the substrate held in the substrate holding unit.

The guide unit is provided with an inner peripheral portion that is in contact with the outer peripheral surface of the substrate held in the substrate holding unit.

The substrate holding unit is provided with a heating mechanism to heat the substrate though the holding surface.

According to the present disclosure, a liquid processing is performed in a state where the substrate is attracted on the holding surface of the substrate holding unit and the height position of the periphery of the substrate is harmonized, and the guide unit that guides the processing liquid discharged from the substrate is formed integrally with the substrate holding unit. Therefore, the processing liquid discharged from the substrate may be guided securely along the guide unit. As a result, since the processing liquid is suppressed from colliding with the guide unit, the processing liquid may be discharged towards the cup while suppressing generation of mist.

Figure 1:
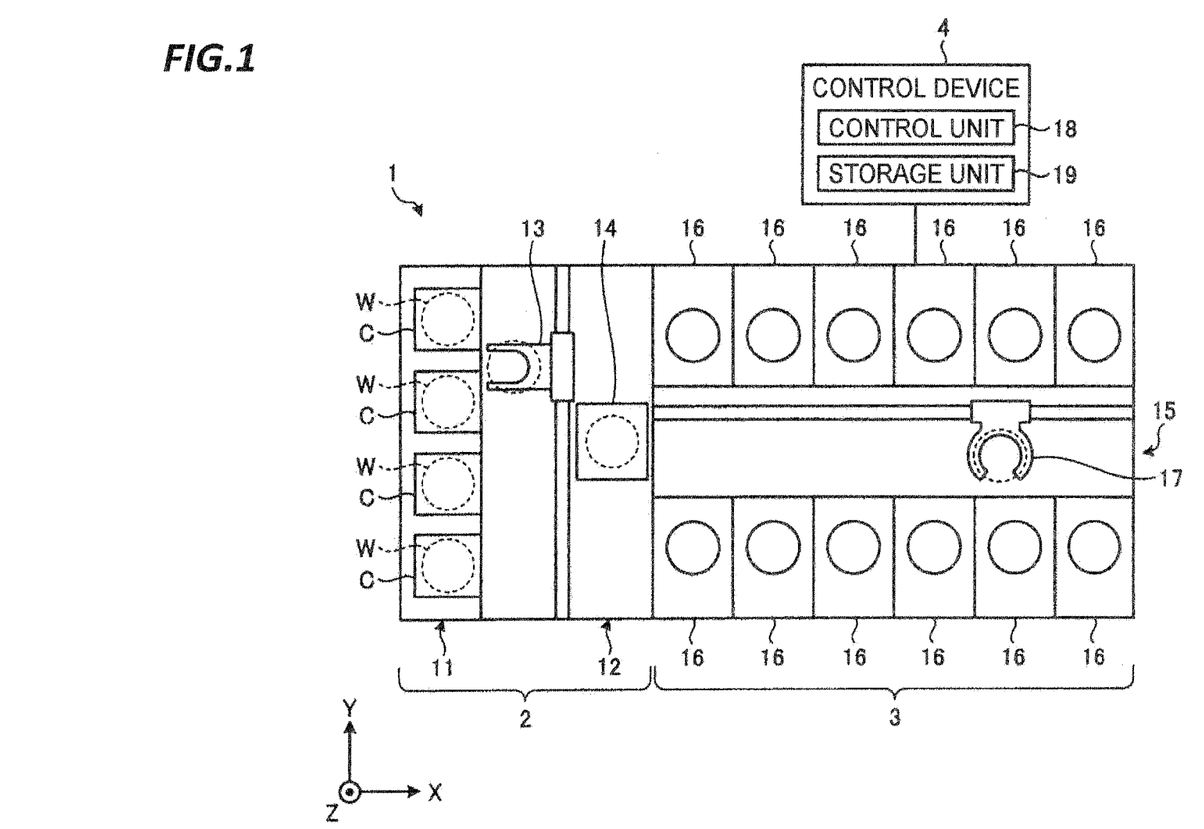
FIG. 1 is a plan view illustrating an outline of a substrate processing system provided with a processing unit according to an exemplary embodiment of the present disclosure.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
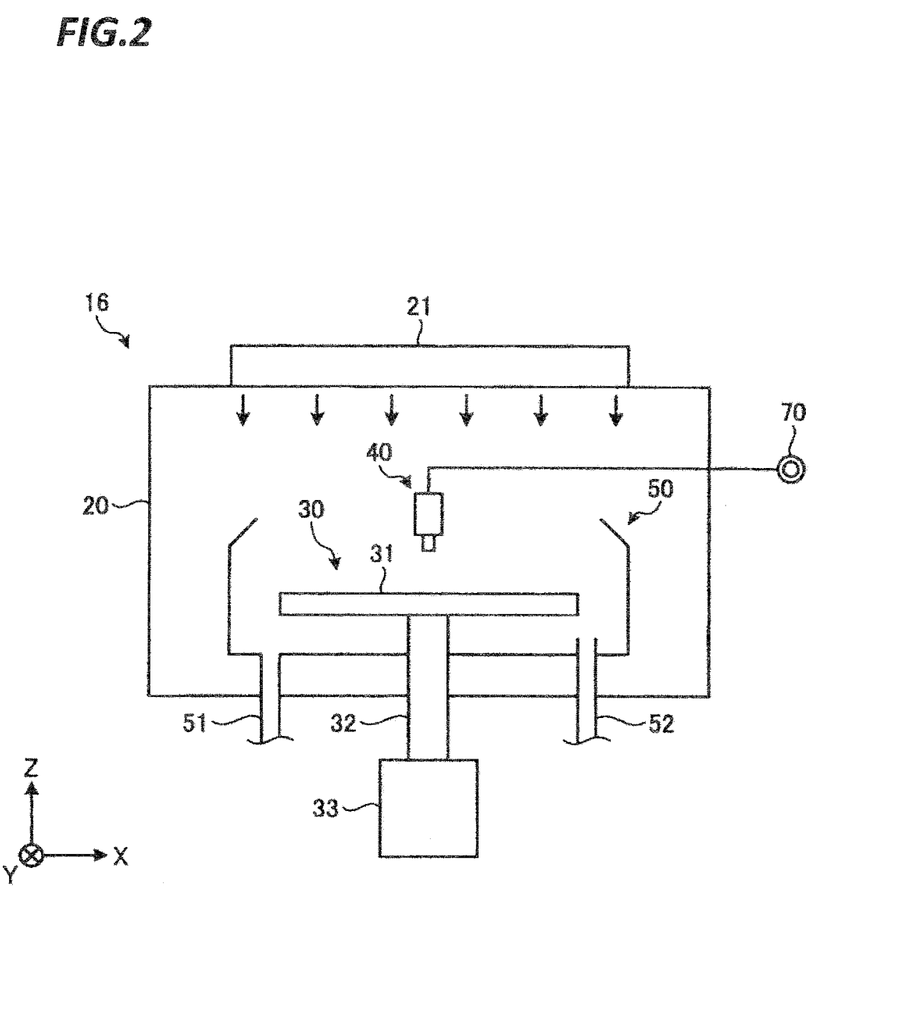
FIG. 2 is a vertical cross-sectional side view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 as outlined above corresponds to the liquid processing apparatus of the present exemplary embodiment. The processing unit 16 has a function to guide the processing liquid towards the recovery cup 50 while suppressing generation of mist from the processing liquid when the processing liquid is discharged from the rotating wafer W. Hereinafter, a configuration related to the above-described functions will be described with reference to FIGS. 3 to 5.

Figure 3:
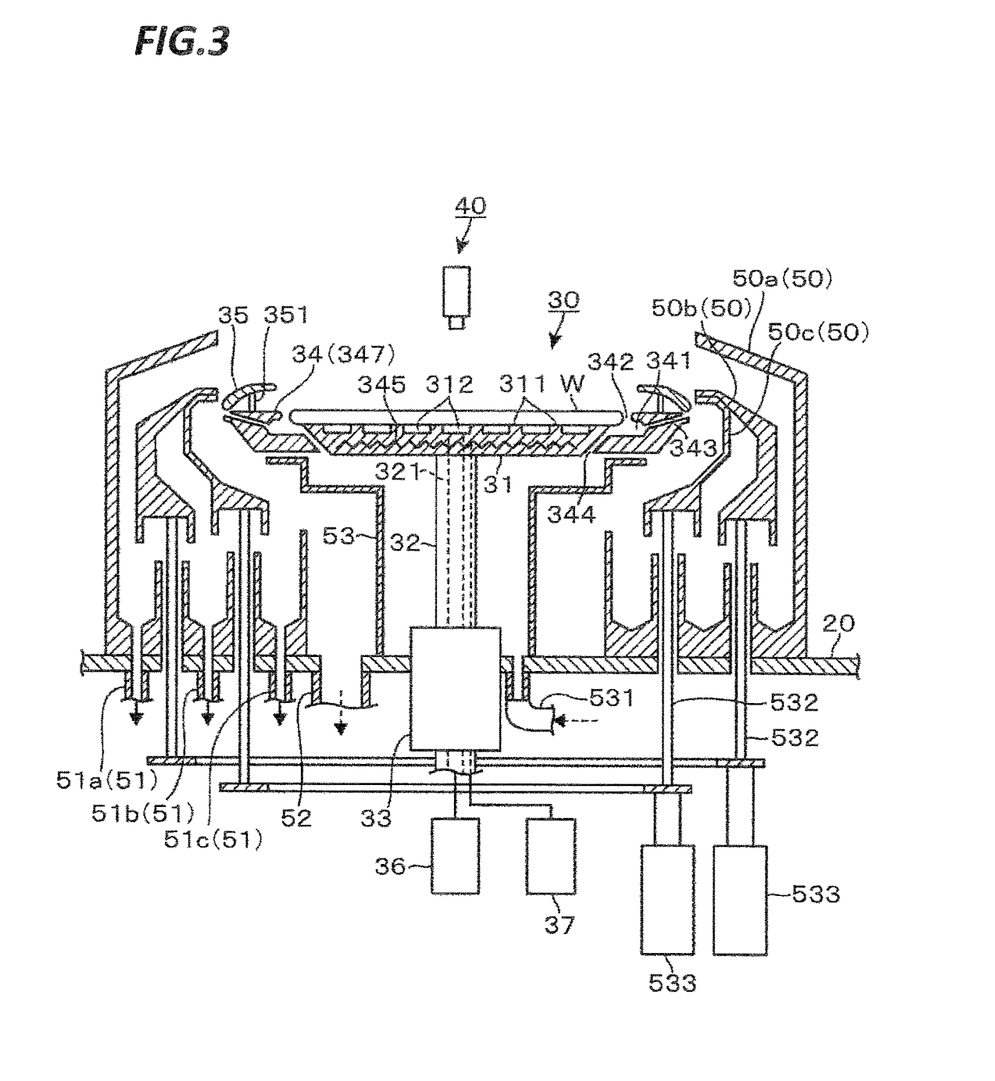
FIG. 3 is a vertical cross-sectional side view illustrating details of a substrate holding mechanism and a recovery cup of the processing unit.

FIG. 3 is a vertical cross-sectional side view illustrating details of the substrate holding mechanism 30 and the recovery cup 50 provided in the processing unit 16.

In the processing unit 16 of the present exemplary embodiment, the above-mentioned recovery cup 50 has a configuration in which, inside an outer cup 50a disposed on a bottom of the chamber 20, a middle cup 50b and an inner cup 50c are disposed in a nested type to be connected to actuators 533 through support members 532. Each of the middle cup 50b and the inner cup 50c is configured to be movable up and down.

The recovery cups 50a to 50c is provided with drain ports 51a to 51c, respectively, which independently discharge processing liquids towards the outside of the processing unit 16. And, since the processing liquids are supplied to the wafer W after the middle cup 50b and the inner cup 50c are moved up or down to a predetermined position, the processing liquids may be discharged separately towards the drain ports 51a to 51c by changing the recovery cups 50a to 50c that receive the processing liquids scattered from the wafer W, depending on the kind of the processing liquids.

Figure 5:
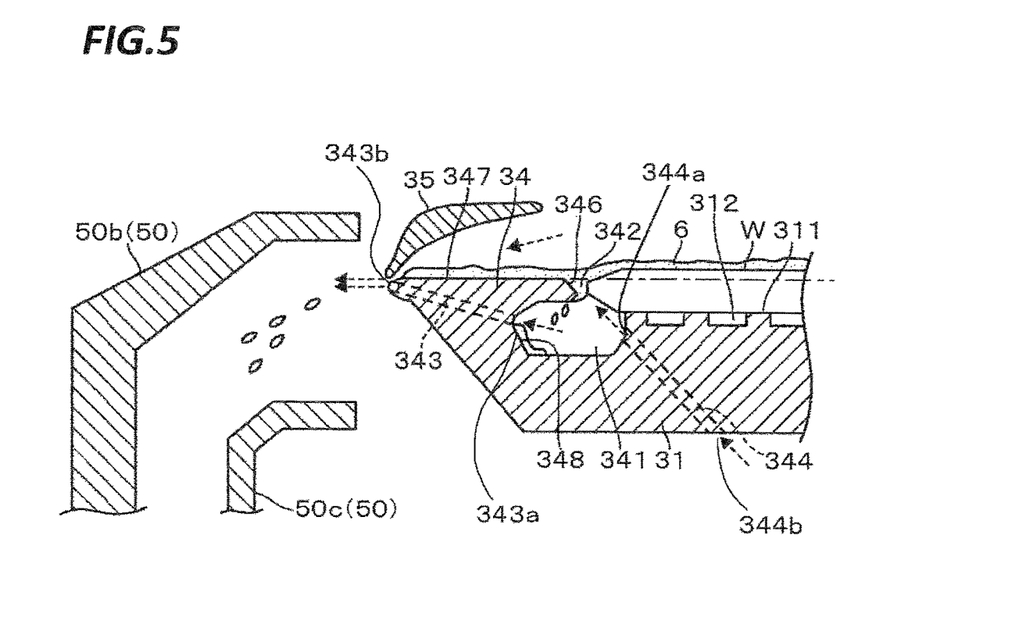
FIG. 5 is a vertical cross-sectional view illustrating a guide unit provided in the holding unit in an enlarged scale.

Although FIGS. 3 and 5 illustrate an example of discharging processing liquids by changing a plurality of recovery cups 50a to 50c depending on the kind of the processing liquids, the processing liquids may be discharged towards a common recovery cup 50 as well.

Next, the configuration of the holding unit 31 (a substrate holding unit) constituting the substrate holding mechanism 30 will be described in detail.

Figure 4:
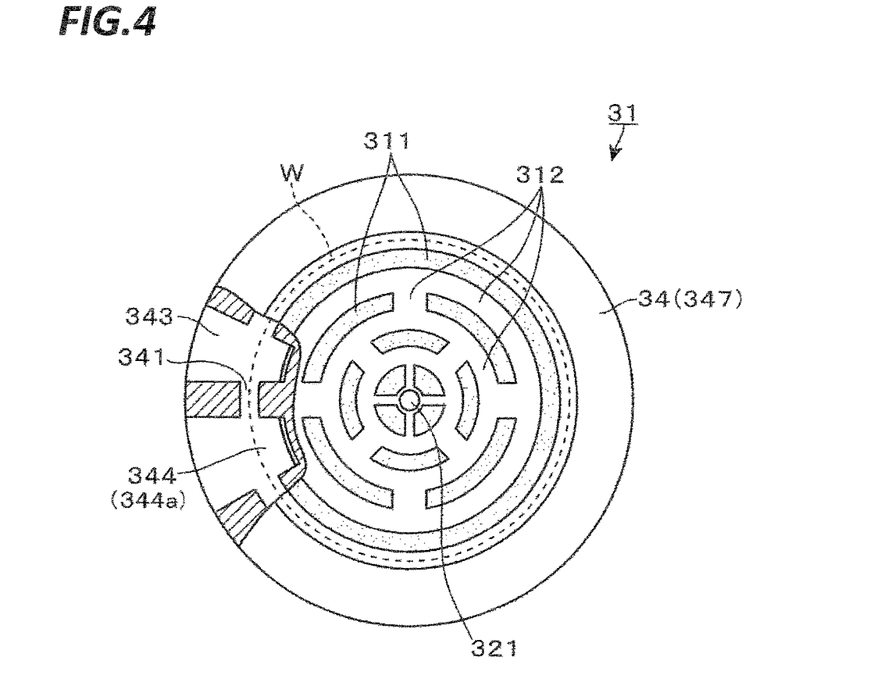
FIG. 4 is a partially cutaway plan view illustrating a holding unit provided in the substrate holding mechanism.

As illustrated in FIGS. 3 and 4, a holding surface 311 on which the holding unit 31 holds the wafer W horizontally is formed with a plurality of groove-shaped recesses 312 concentrically along the circumferential direction of the holding unit 31 formed in a disc shape. Among the recesses 312, the recess 312 at the outermost side is provided near the periphery of the wafer W. As illustrated in FIG. 4, the recesses 312 disposed adjacent to each other communicate with each other through the recesses 312 formed by cutting the holding surface 311 radially. Meanwhile, a vacuum exhaust path 321 passes through the inside of the support unit 32 and is connected to an external vacuum pump 36, and an end of the vacuum exhaust path 321 is opened to the central portion of the holding unit 31 (see, e.g., FIG. 3).

In the holding unit 31 having the above-mentioned configuration, when the wafer W is placed above the holding surface 311, the recesses 312 form a space surrounded by the wafer W and the body of the holding unit 31, and a vacuum chuck is configured by decompressing the space (the recesses 312) through the vacuum exhaust path 321 to attract and hold the bottom surface of the wafer W towards the holding surface 311. The recesses 312 formed in the holding unit 31, or the vacuum exhaust path 321 and the vacuum pump 36 correspond to an attraction mechanism for attracting and holding the wafers W in the holding unit 31.

A guide unit 34 is provided around the wafer W held in the holding unit 31 to guide the processing liquid flowing on the wafer W. As illustrated in FIGS. 3 to 5, the guide unit 34 of the present exemplary embodiment is formed integrally with a disc-shaped member constituting the holding unit 31, and provided with an annular guide surface 347 which is disposed to surround the periphery of the holding surface 311 of the wafer W.

As illustrated in the enlarged vertical cross-sectional view of FIG. 5, the guide surface 347 of the guide unit 34 is flat, and disposed at a position which is equal to or lower than the height of the top surface of the wafer W held on the holding surface 311.

FIG. 5 illustrates an example in which the guide surface 347 is provided at a position lower than the top surface of the wafer W and higher than the bottom surface of the wafer W. The lower limit of the height of the guide surface 347 to be provided may be any position which is higher than the bottom surface of the wafer W.

Further, the guide unit 34 is provided with a region facing an outer peripheral surface of the wafer W. Hereinafter, the region facing the outer peripheral surface of the wafer W in the guide unit 34 will be referred to as an inner peripheral portion 346. As illustrated in FIG. 5, the inner peripheral portion 346 of the present exemplary embodiment is disposed through a gap 342 of a sub-millimeter to several millimeters.

As the rotation speed of the wafer W decreases when the outer peripheral surface of the wafer W and the inner peripheral portion 346 of the guide unit 34 face each other across the gap 342, a processing liquid 6 may enter into the gap 342 and wrap around the outer peripheral surface of the wafer W or the periphery of the bottom surface side so that these regions are processed. In this case, the processing range of the wafer W may be adjusted by changing the rotation speed of the wafer W.

Further, as illustrated in FIG. 5, a groove 341 is provided below the gap 342 between the outer peripheral surface of the wafer W in the holding unit 31 and the inner peripheral portion 346 of the guide unit 346 to receive the processing liquid 6 that enters into the gap 342. The vertical cross-section of the groove 341 is a flat space that extends over the lower side of the guide surface 347 from the lower side of the bottom surface of the periphery of the wafer W. This space extends annularly along the circumferential direction of the wafer W.

As illustrated in FIGS. 4 and 5, the top surface of the groove 341 is opened at the wafer W side, and when the wafer W is held on the holding surface 311, the periphery of the wafer W protrudes to the groove 341 side such that the bottom surface of the periphery is exposed to the space of the groove 341. Since the groove 341 is provided, the processing liquid wrapping around the bottom side of the wafer W is suppressed from flowing to any place other than the recovery cups 50a to 50c.

Meanwhile, in the guide unit 34 side, the guide surface 347 extends to cover the top surface of the outer peripheral side of the groove 341, thereby forming the inner peripheral portion 346 as described above. In the present exemplary embodiment, the vertical cross-section of the inner peripheral portion 346 is formed with a top surface side inclined surface that ascends from the outer peripheral surface of the wafer W towards the guide surface 347, and a bottom surface side inclined surface that descends from the outer peripheral surface of the wafer towards a top surface of the groove 341. As a result, the processing liquid 6 that has entered into the gap 342 is guided efficiently to the guide surface 347 along the top surface of the top surface side inclined surface that ascends towards the outer peripheral direction. In addition, the processing liquid 6 is guided efficiently into the groove 341 along the bottom surface side inclined surface that descends towards the outer peripheral direction. The top surface side inclined surface and the bottom surface side inclined surface intersect at the outer peripheral surface side of the wafer W, and the inner peripheral portion 346 is provided with a tip pointed towards the outer peripheral surface of the wafer W. The processing liquid 6 that has entered into the gap 342 is guided more efficiently to the guide surface 347 and the groove 341 by processing the inner peripheral portion 346 to be pointed towards the outer peripheral surface side of the wafer W.

On the sidewall of the outer peripheral side of the groove 341, a slit type drain path 343 is formed towards the outer peripheral surface of the holding unit 31 to discharge the processing liquid 6 dropped in the groove 341 to the outside by using a centrifugal force (a notched portion in FIG. 4). Here, the notched portion represents a state where the holding unit 31 is notched along the forming surfaces of the drain path 343, the groove 341, and a gas supply path 344 to be described later.

As illustrated in FIG. 5, a drain path inlet 343a is formed at the outer peripheral surface side of the groove 341 and serves as an opening to guide the processing liquid 6 dropped in the groove 341 towards the drain path 343. An inclined surface 348 is provided at the outer peripheral surface side of the groove 341 to guide the processing liquid 6 dropped in the groove 341 towards the drain path inlet 343a. Further, a drain path outlet 343b of the drain path 343 is opened at a position to discharge the processing liquid 6 in the drain path 343 towards a position joining a flow of the processing liquid 6 flowing on the guide surface 347 of the guide unit 34 and scattered from the holding unit 31.

Further, in order to suppress additional wraparound of the processing liquid 6 that has entered the bottom surface of the periphery of the wafer W through the gap 342 and to facilitate drying of the wafer W, a gas ejection port 344a is provided in the groove 341 to spray gas towards a bottom surface side of the periphery of the wafer W (see, e.g., FIGS. 4 and 5). The gas ejection port 344a is opened to the sidewall of the inner peripheral side of the groove 341, and ejects gas towards the bottom surface of the periphery of the wafer W. Therefore, the gas is ejected from the inner peripheral direction of the wafer W towards the outer peripheral direction, and then, supplied towards the bottom surface of the periphery of the wafer W, thereby suppressing additional wraparound of the processing liquid 6 that has entered the bottom surface of the periphery of the wafer W through the gap 342. Meanwhile, the gas supply path 344 extends towards the bottom surface side of the guide portion 34 to supply gas to the gas ejection port 344a, and a gas inlet 344b of the gas is opened to the bottom surface of the holding unit 31 and takes the gas from the bottom surface side region of the holding unit 31.

In the present exemplary embodiment, the bottom surface side of the holding unit 31 to which the gas inlet 344b of the gas supply path 344 is opened is surrounded by a cylindrical surrounding member 53 disposed to surround the periphery of the support unit 32 that supports the holding unit 31. Further, as illustrated in FIG. 3, the gas supply path 344 is formed to extend from the gas inlet 344b of the bottom surface of the holding unit 31 towards the gas ejection port at the upper side in the outer peripheral direction when viewed from the top. In this case, the gas supply path 344 may be formed such that the width of the gas supply path 344 is widened from the gas inlet 344b towards the gas ejection port 344a. The bottom surface of the chamber 20 in a space surrounded by the surrounding member 53 is connected with a gas supply pipe 531 configured to supply gas such as clean air into the space. As a result, the gas supplied into the space surrounded by the surrounding member 53, the bottom surface of the chamber 20, and the holding unit 31 is introduced into the gas supply path 344.

Here, in supplying the gas to the gas supply path 344, it is not essential to surround the bottom surface of the holding unit 31 by the surrounding member 53 or supply the gas to the space surrounded by the surrounding member 53. For example, natural supply may be performed to take gas of the bottom surface side of the holding unit 31 into the gas supply path 344 by using a pressure drop of the groove 341 as the processing liquid 6 or gas in the groove 341 is discharged from the drain path 343 by an action of a centrifugal force.

An annular rotary cup 35 is provided at the top surface side of the guide surface 347 to guide the processing liquid 6 flowing on the guide surface 347 towards the peripheral side of the holding unit 31 or an air flow flowing thereabove. As illustrated in FIG. 3, the rotary cup 35 is supported by support members 351 that are spaced apart from each other along the circumferential direction of the holding unit 31, and is disposed above the guide surface 347 provided in the guide unit 34. As illustrated in the vertical cross-sectional view of FIG. 5, the rotary cup 35 discharges the processing liquid discharged from the wafer W towards the recovery cup 50. A bottom surface of the rotary cup 35 is formed with an inclined surface that descends gradually from a radially central portion side of the holding unit 31 towards the peripheral portion. By the inclined surface, a gap formed between the bottom surface of the rotary cup 35 and the guide surface 347 narrows gradually towards the peripheral side of the holding unit 31 so that the processing liquid 6 or the air flow is discharged towards each of the recovery cups 50a to 50e.

Further, as illustrated in FIG. 3, the holding unit 31 is provided with a heater 345 constituting a heating mechanism configured to heat the wafer W such that a processing of the wafer W with the processing liquid is performed under a constant temperature condition. The heater 345 is constituted with, for example, a resistance heating element, and connected to an external power feeding unit 37. Then, a power feeding amount to the heater 345 is increased or decreased based on a temperature detection result of a temperature detecting unit (not illustrated) including a thermocouple provided near the surface of the holding unit 31 such that a detected temperature value becomes a preset temperature value. Further, the wafer W may be heated by supplying a predetermined power feeding amount to the heater 345 without performing a temperature control of the wafer W.

Actions of the processing unit 16 having a configuration as described above will be described. A wafer W transferred to each processing unit 16 by the substrate transfer device 17 is carried into the chamber 20 through the carry-in/out port (not illustrated). The substrate holding mechanism 30 delivers a processing target wafer W from the wafer holding mechanism of the substrate transfer device 17 onto the holding surface 311 of the holding unit 31 through elevation pins (not illustrated), and then, retreated from the inside of the chamber 20.

When the wafer W is placed on the holding unit 31, the bottom surface of the wafer W is attracted towards the holding surface 311 by evacuating the inside of the recesses 312 through an evacuation path 321. Here, in a case where the wafer W placed on the holding unit 31 is warped, the wafer W is attracted towards the flat holding surface 311 so that the warpage of the wafer W is corrected. Therefore, the wafer W is held on the holding unit 31 in a flat state.

Further, power is fed from the power feeding unit 37 to the heater 345 to start heating of the wafer W.

Subsequently, the holding unit 31 is rotated by the driving unit 33 (the rotation driving unit). When the holding unit 31 arrives at a predetermined rotation speed, the nozzle of the processing liquid supply mechanism 40 is moved to the processing position above the wafer W in a predetermined order to supply processing liquids such as an acidic or alkaline chemical liquid, and a rinse liquid, thereby performing a liquid processing. At this time, since the middle cup 50b or the inner cup 50c is moved up or down depending on the kind of the processing liquids, each processing liquid is received in different recovery cups 50a to 50c, and discharged to the drain units 51a to 51c for exclusive use of each processing liquid.

At this time, since the wafer W directly comes in contact with the holding unit 31 provided with the heater 345 through the holding unit 311, the temperature of the wafer W may be controlled by the heater 345. As a result, as the temperature of the processing liquid is changed while the processing liquid is spread on the surface of the wafer W, the liquid processing may be performed uniformly in plane of the wafer W while suppressing the processing result from being non-uniform in plane.

The processing liquid supplied to the wafer W is spread on the surface of the rotating wafer W to reach the periphery of the wafer W, and then, discharged towards the guide surface 347 of the guide unit 34. As described above, the guide surface 347 of the guide unit 34 is provided at a position equal to or lower than the height of the top surface of the wafer W held on the holding surface 311 (see, e.g., FIG. 5). In other words, since the guide surface 347 is not disposed at a position higher than the top surface of the wafer W, the processing liquid 6 discharged from the wafer W is suppressed from colliding with the body of the guide unit 34. Therefore, generation of mist may be suppressed.

At this time, the wafer W is attracted and held on the holding unit 31 throughout the entire region up to the periphery thereof. Thus, even in a case where the processing target wafer W is warped, the wafer W may be disposed at the inner side of the guide unit 34 in a state where the warpage is corrected and the height position of the periphery of the wafer W is harmonized with a predetermined height, thereby performing the liquid processing.

As illustrated in FIG. 5, the processing liquid 6 flowing out to the guide surface 347 flows in a gap between the guide surface 347 and the bottom surface of the rotary cup 35 along with the air flow supplied from the FFU 21 and flows towards the periphery of the guide surface 347 (the holding unit 31).

Then, the processing liquid 6 or the air flow reaching the periphery of the guide surface 347 is guided to the rotary cup 35 and the guide surface 347 (the guide unit 34), and scattered from the gap of these members towards any one of the recovery cups 50a to 50c depending on the moving-up/down state of the middle cup 50b and the inner cup 50c.

In a case of processing the bottom surface side of the outer peripheral surface or the periphery of the wafer W, the processing liquid 6 is introduced into the gap 342 between the inner peripheral portion 346 of the guide unit 34 and the wafer W by rotating the wafer W at a predetermined rotation speed, thereby performing the processing of these region. At this time, the processing liquid 6 that has entered to an upper side of the tip of the sharp inner peripheral portion 346 is guided to the inclined surface of the top surface side of the inner peripheral portion 346, and flows out towards the guide surface 347. Further, the processing liquid 6 that has entered to the lower side of the tip is guided to the inclined surface of the bottom surface side of the inner peripheral portion 346 and dropped in the groove 341.

The processing liquid 6 dropped in the groove 341 is guided to the inclined surface 348 provided at the outer peripheral surface side of the groove 341, flows towards the drain path inlet 343a of the drain path 343, and enters into the drain path 343 along with the gas in the groove 341. The processing liquid 6 or the gas flowing in the drain path 343 join the flow of the processing liquid 6 scattered from the holding unit 31 at the drain path outlet 343b to be discharged to the same recovery cups 50a to 50c.

Further, gas below the holding unit 31 is taken into the gas supply path 344 that is opened towards the bottom surface of the guide unit 34, and the gas is sprayed towards the bottom surface side of the wafer W that is disposed to protrude to the top surface of the groove 341. As a result, even in a case where the processing liquid 6 wrap around the bottom surface side of the wafer W, the gas is sprayed from the gas supply path 344 so that an additional wraparound of the processing liquid 6 is prevented, and the drying of the wafer W is facilitated. Therefore, the processing liquid 6 may be suppressed from entering into the recesses 312 connected to the vacuum pump 36.

The liquid processing of the wafer W using the processing liquid is performed in this manner, rinsing is performed, shake-off drying is performed, and then, the rotation of the holding unit 31 is stopped. Then, the wafer W is delivered to the wafer holding mechanism, which has entered into the chamber 20, in an order opposite to that performed when carrying into the chamber 20, so that the wafer W is carried out from the processing unit 16.

The processing unit 16 according to the present exemplary embodiment provides the following effects. The wafer W is attracted to the holding surface 311 of the holding unit 31 by the attraction mechanism (the recesses 312 formed in the holding unit 31, or the vacuum exhaust path 321 and the vacuum pump 36), the liquid processing is performed in a state where the height position of the periphery of the wafer W is harmonized, and the guide unit 34 that guides the processing liquid discharged from the wafer W is formed integrally with the holding unit 31. Therefore, the processing liquid discharged from the wafer W may be guided securely along the guide surface 347 of the guide unit 34. As a result, since the processing liquid is suppressed from colliding with the guide unit 34, the processing liquid may be discharged towards the recovery cups 50a to 50c while suppressing generation of mist.

Figure 6:
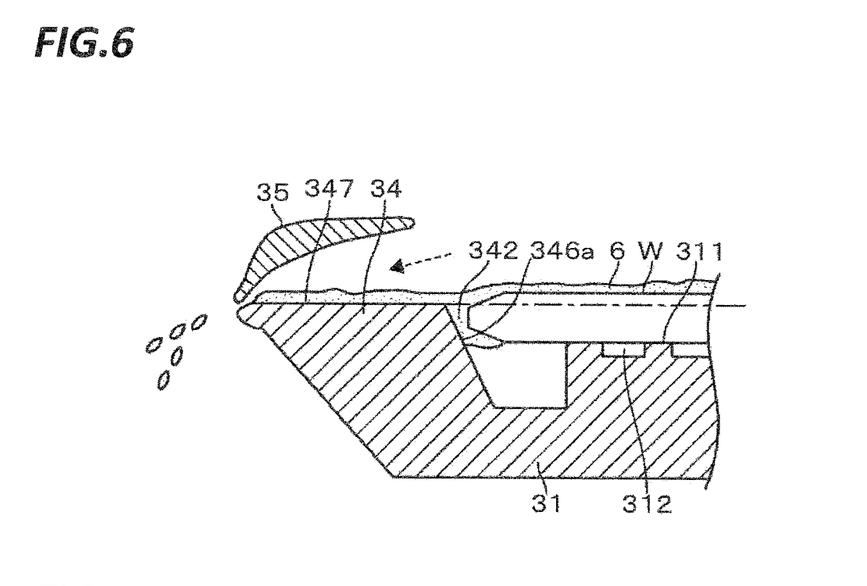
FIG. 6 is a vertical cross-sectional view illustrating a guide unit according to another exemplary embodiment.

Next, a structural variation of the guide unit 34 will be described. FIG. 6 illustrates a configuration of a holding unit 31 provided with a guide unit 34 according to another exemplary embodiment. In the guide unit 34 of the present exemplary embodiment, a gap 342 that allows entry of a processing liquid 6 is formed between an inclined surface 346a that ascends gradually from the radially inner side of the holding unit 31 towards the outer side and the outer peripheral surface of the wafer W. In this regard, the guide unit 34 of the present exemplary embodiment is different from the exemplary embodiment of FIG. 5 in which the gap 342 is formed between the outer peripheral surface of the wafer W and the inner peripheral portion 346 having a vertical cross-section processed to be pointed towards the outer peripheral surface side of the wafer W.

The processing liquid 6 that has entered into the gap 342 is guided to the inclined surface 346a to flow out towards a guide surface 347. Further, in a case where the processing liquid is dropped in a groove 341, the processing liquid in the groove 341 may be discharged towards the gap 342 by increasing the rotation speed of the holding unit 31 during a rinsing or a shake-off drying. Similarly to the exemplary embodiment of FIG. 5, the guide unit 34 may be provided with a drain path 343 with an inlet opened towards the inclined surface 346a. Although not illustrated in FIG. 6, in order to maintain the periphery of the bottom surface side of the wafer W in a dry state, a gas supply path 344 may be provided in the groove 341 to be opened so as to spray gas towards the periphery.

Figure 7:
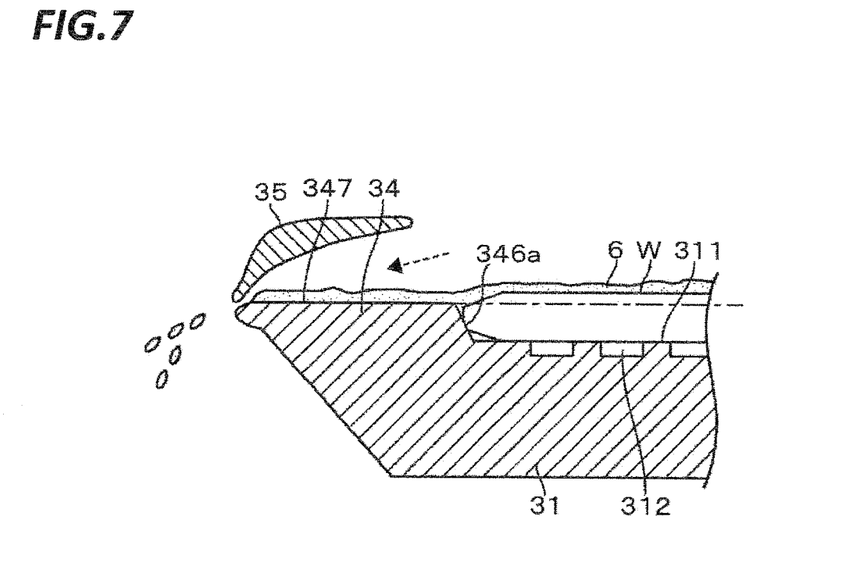
FIG. 7 is a vertical cross-sectional view illustrating a guide unit according to still another exemplary embodiment.

Next, FIG. 7 illustrates an example of a guide unit 34 in which the inclined surface 346 and the outer peripheral surface of the wafer W are brought into direct contact with each other without providing a gap 342 between the inclined surface 346a formed at the inner peripheral surface side of the guide unit 34 and the wafer W. In this case, since the processing liquid 6 is not allowed to enter between the inclined surface 346a and the wafer W, a processing with a processing liquid is not performed below the region which is in contact with both the inclined surface 346a and the wafer W.

Figure 8:
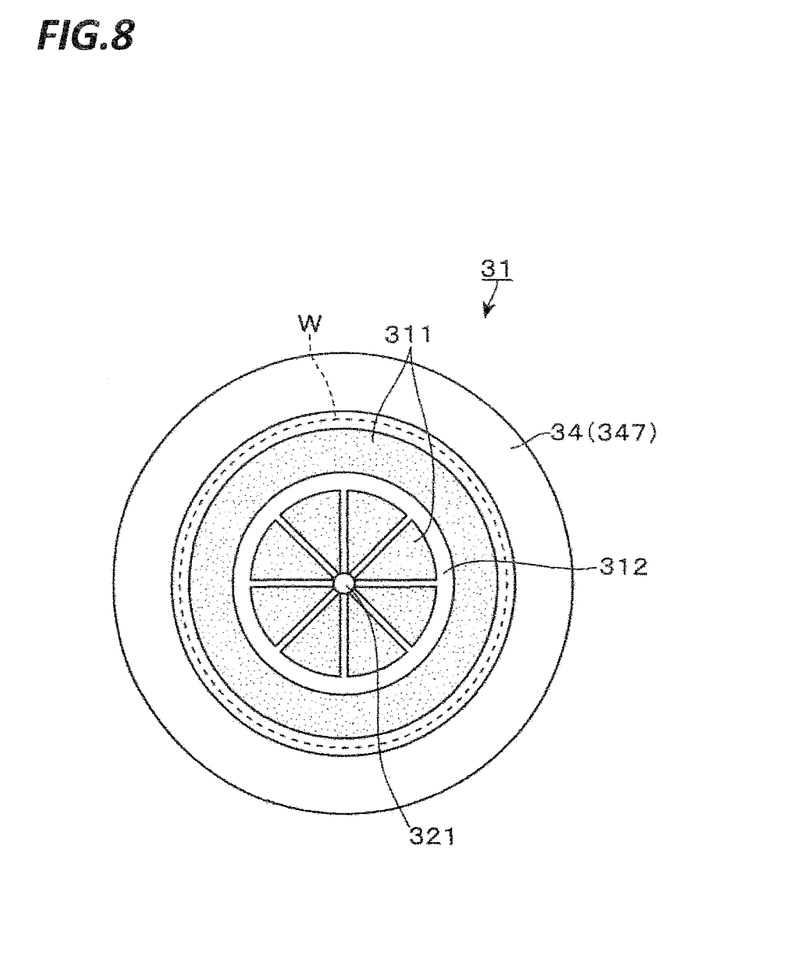
FIG. 8 is a plan view illustrating another configuration of a vacuum provided in the holding unit.

Further, in a case where the attraction mechanism is configured by a vacuum chuck, the recesses 312 may not be formed near the periphery of the wafer W. For example, FIG. 8 illustrates an example in which the recesses 312 are provided at a position spaced apart from the periphery of the wafer W by approximately one third of the radius of the wafer W. Even in such a case, there is no particular limit to a position where the recesses 312 are located as long as a force is applicable to correct a warpage of the wafer W such that the height position of the periphery is harmonized when the wafer W is attracted towards the holding surface 311.

The configuration of the attraction mechanism is not limited to the vacuum chuck method in which the wafer W is attracted by the evacuated recesses 312. For example, the attraction mechanism may be configured with an electrostatic chuck in which the holding unit 31 or the guide unit 34 is made of a dielectric material, a sheet type chuck electrode that is connected to a direct current power supply is embedded in the holding unit 31, and the wafer is attracted and held by electrostatic attraction.

Further, the guide surface 347 provided in the guide unit 34 is not limited to a case of a flat configuration. For example, similarly to the bottom surface of the rotary cup 35, the processing liquid may be guided towards the cups 50a to 50c by a guide surface 347 that is curved downwardly towards the outer peripheral side.

And, the kind of the substrate to be processed using the liquid processing unit (the liquid processing apparatus) of the present disclosure is not limited to the semiconductor wafer. For example, the present disclosure may also be applied to a liquid processing unit which performs a liquid processing of a glass substrate for flat panel display.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus for performing a liquid processing on a substrate, the apparatus comprising:
    a substrate holding unit including a holding surface to attract and hold a bottom surface of the substrate horizontally, the holding surface including a recess thereon;
    a vacuum exhaust path including a first end connected to an external vacuum pump and a second end coupled to the substrate holding unit through the recess;
    a rotation driving unit configured to rotate the substrate holding unit around a vertical axis;
    a cup configured to receive a processing liquid supplied to the substrate while the substrate is rotating, wherein the cup is connected via a support member to an actuator configured to control the elevation of the cup;
    a processing liquid supplying unit configured to supply the processing liquid to an upper side of the substrate held in the substrate holding unit;
    a guide unit formed integrally with the substrate holding unit, disposed around the substrate held in the substrate holding unit, and provided at a position equal to or lower than a height of a top surface of a periphery of the substrate, the guide unit including a guide surface configured to guide the processing liquid and an inner peripheral portion configured to face an outer peripheral surface of the substrate held in the substrate holding unit; and
    a rotary cup configured to rotate integrally with the substrate holding unit and guide the processing liquid towards the cup between the rotary cup and the guide unit,
    wherein the inner peripheral portion is formed with a gap with respect to the outer peripheral surface of the substrate held in the substrate holding unit,
    the substrate holding unit further includes a groove right below the gap,
    the groove is formed continuously within the holding surface and is configured to receive the processing liquid that enters the gap, and a vertical cross-section of the groove is a flat space that extends over a lower side of the guide surface from a lower side of the bottom surface of the periphery of the substrate, the substrate holding unit further includes:
- a drain path configured to discharge the processing liquid in the groove towards the cup;
- a drain path inlet formed at an outer peripheral surface side of the groove and configured to guide the processing liquid dropped in the groove through the gap to the drain path, and an inclined surface formed at the outer peripheral surface side of the groove to guide the processing liquid in the groove towards the drain path inlet; and
- a drain path outlet configured to discharge the processing liquid from the groove via the drain path towards a position joining a flow of the processing liquid flowing on the guide surface of the guide unit, and the inclined surface is inclined upwardly from a bottom of the groove to the drain path inlet.

2. The liquid processing apparatus of claim 1, wherein the inner peripheral portion has an inclined surface with its vertical cross-section facing the outer peripheral surface of the substrate.

3. The liquid processing apparatus of claim 1, wherein the inner peripheral portion has an inclined surface with its vertical cross-section facing the outer peripheral surface of the substrate, and the inclined surface is formed with a top surface side inclined surface that ascends from the outer peripheral surface of the substrate towards the guide surface, and a bottom surface side inclined surface that descends from the outer peripheral surface of the substrate towards a top surface of the groove.

4. The liquid processing apparatus of claim 1, wherein the substrate holding unit further includes
- a gas ejection port configured to supply gas towards the periphery at a bottom surface side of the substrate, and
- a gas supply path to supply gas to the gas ejection port.

5. The liquid processing apparatus of claim 1, wherein the groove is formed at a position lower than the bottom surface of the substrate held in the substrate holding unit.

6. The liquid processing apparatus of claim 1, wherein the guide unit includes an inner peripheral portion that is in contact with the outer peripheral surface of the substrate held in the substrate holding unit.

7. The liquid processing apparatus of claim 1, wherein the substrate holding unit further includes a heating mechanism to heat the substrate though the holding surface.

8. The liquid processing apparatus of claim 1, further comprising:
- a controller configured to control an overall operation of the liquid processing apparatus,
- wherein the controller is configured to change the rotation speed of the substrate holding unit by the rotation driving unit in order to adjust the processing range of the substrate.

9. The liquid processing apparatus of claim 8, wherein the controller is configured to control the rotation driving unit such that the substrate is rotated at a predetermined rotation speed, thereby introducing the processing liquid into the gap between the inner peripheral portion of the guide unit and the substrate to perform a liquid processing on a bottom surface side of the outer peripheral surface or the periphery of the substrate.

* * * * *